(12) United States Patent
Kim et al.

(10) Patent No.: US 11,700,757 B2
(45) Date of Patent: Jul. 11, 2023

(54) COLOR CONVERSION PANEL AND DISPLAY DEVICE INCLUDING THE SAME

(71) Applicant: Samsung Display Co., Ltd., Yongin-Si (KR)

(72) Inventors: Jang-Il Kim, Asan-si (KR); Jeongki Kim, Hwaseong-si (KR); Myoungjong Lee, Cheonan-si (KR); Tae Hyung Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 235 days.

(21) Appl. No.: 16/896,126

(22) Filed: Jun. 8, 2020

(65) Prior Publication Data
US 2021/0036063 A1 Feb. 4, 2021

(30) Foreign Application Priority Data

Aug. 2, 2019 (KR) .......................... 10-2019-0094156

(51) Int. Cl.
| | |
|---|---|
| *H10K 59/38* | (2023.01) |
| *G02B 5/22* | (2006.01) |
| *H10K 50/86* | (2023.01) |
| *H10K 59/12* | (2023.01) |
| *H10K 102/00* | (2023.01) |

(52) U.S. Cl.
CPC .............. *H10K 59/38* (2023.02); *G02B 5/22* (2013.01); *H10K 50/865* (2023.02); *H10K 59/12* (2023.02); *H10K 2102/3026* (2023.02)

(58) Field of Classification Search
CPC .............. H01L 27/322; H01L 27/3244; H01L 51/5284; H01L 2251/5315; G02B 5/22
USPC ........................................................ 257/40
See application file for complete search history.

(56) References Cited

U.S. PATENT DOCUMENTS

| | | | | |
|---|---|---|---|---|
| 2016/0357039 A1* | 12/2016 | Kim | .................. | G02F 1/133512 |
| 2018/0210282 A1* | 7/2018 | Song | ..................... | H01L 33/505 |

FOREIGN PATENT DOCUMENTS

| | | |
|---|---|---|
| KR | 10-2019-0016631 A | 2/2019 |
| KR | 10-2019-0036649 A | 4/2019 |

* cited by examiner

*Primary Examiner* — Xia L Cross
(74) *Attorney, Agent, or Firm* — Innovation Counsel LLP (57) ABSTRACT

In a color conversion panel including pixel areas emitting a light having a same color and a non-pixel area between the pixel areas, the color conversion panel may include a substrate, a light shielding pattern disposed on the substrate in the non-pixel area, a color conversion layer disposed on the substrate, covering the light shielding pattern, and configured to convert an incident light, a height of a first portion of the color conversion layer corresponding to the non-pixel area from the substrate being less than each of heights of second portions of the color conversion layer respectively corresponding to the pixel areas from the substrate, and a light shielding partition wall disposed on the color conversion layer in the non-pixel area.

17 Claims, 8 Drawing Sheets

COLOR CONVERSION PANEL AND DISPLAY DEVICE INCLUDING THE SAME

CROSS-REFERENCE TO RELATED APPLICATION(S)

This application claims priority to and the benefit of 35 USC § 119 to Korean Patent Application No. 10-2019-0094156 filed on Aug. 2, 2019 in the Korean Intellectual Property Office (KIPO), the entire disclosure of the Korean Patent Application which is incorporated by reference herein.

BACKGROUND

1. Field

The technical field relate to a display device. More particularly, embodiments relate to a display device including a color conversion panel.

2. Description of the Related Art

With the development of information technology, the market for display devices, which acts as a connection medium between users and information, is growing. Accordingly, there is an increase in the use of flat panel display devices such as organic light emitting display devices, liquid crystal display devices, or the like.

Recently, a display device including a color conversion panel has been proposed to implement a display device having a high light efficiency.

SUMMARY

Embodiments provide a color conversion panel having an improved light efficiency and a display device including the color conversion panel.

A color conversion panel including pixel areas each emitting a light having a same color and a non-pixel area between the pixel areas according to embodiments, the color conversion panel may include a substrate, a light shielding pattern disposed on the substrate in the non-pixel area, a color conversion layer disposed on the substrate, covering the light shielding pattern, and configured to convert an incident light, a height of a first portion of the color conversion layer corresponding to the non-pixel area from the substrate being less than each of heights of second portions of the color conversion layer respectively corresponding to the pixel areas from the substrate, and a light shielding partition wall disposed on the color conversion layer in the non-pixel area.

In an embodiment, a height of the color conversion layer from the substrate at a adjacent to a boundary between the pixel area and the non-pixel area may decrease closer to the non-pixel area.

In an embodiment, a thickness of the first portion of the color conversion layer corresponding to the non-pixel area may be less than each of thicknesses of the second portions of the color conversion layer respectively corresponding to the pixel areas.

In an embodiment, the second portions of the color conversion layer respectively corresponding to the pixel areas may be connected to each other through the first portion of the color conversion layer corresponding to the non-pixel area.

In an embodiment, the second portions of the color conversion layer respectively corresponding to the pixel areas may be separated from each other.

In an embodiment, a first groove may be formed at the first portion of the color conversion layer corresponding to the non-pixel area, and the light shielding partition wall may be disposed in the first groove.

In an embodiment, a height difference between the light shielding partition wall and the second portions of the color conversion layer respectively corresponding to the pixel areas may be less than a depth of the first groove.

In an embodiment, a second groove may be formed at the second portions of the color conversion layer respectively corresponding to the pixel areas.

In an embodiment, a depth of the second groove may be less than a depth of the first groove.

In an embodiment, the first groove may have a line shape, and the second groove may have a dot shape.

In an embodiment, the color conversion layer may include at least one of a quantum dot and a fluorescent substance.

In an embodiment, the color conversion panel may further include a color filter disposed between the substrate and the color conversion layer and blocking the incident light that is not converted by the light conversion layer.

In an embodiment, the color conversion panel may further include a capping layer disposed on the color conversion layer.

A display device including pixel areas each emitting a light having a same color and a non-pixel area between the pixel areas according to embodiments, the display device may include a display panel and a color conversion panel overlapping the display panel. The color conversion panel may include a substrate, a light shielding pattern disposed on the substrate in the non-pixel area, a color conversion layer disposed on the substrate and covering the light shielding pattern, a height of a first portion of the color conversion layer corresponding to the non-pixel area from the substrate being less than each of heights of second portions of the color conversion layer respectively corresponding to the pixel areas from the substrate, and a light shielding partition wall disposed on the color conversion layer in the non-pixel area.

In an embodiment, a height of the color conversion layer from the substrate at a adjacent to a boundary between the pixel area and the non-pixel area may decrease closer to the non-pixel area.

In an embodiment, a thickness of the first portion of the color conversion layer corresponding to the non-pixel area may be less than each of thicknesses of the second portions of the color conversion layer respectively corresponding to the pixel areas.

In an embodiment, a groove may be formed at the first portion of the color conversion layer corresponding to the non-pixel area, and the light shielding partition wall may be disposed in the groove.

In an embodiment, a height difference between the light shielding partition wall and the second portions of the color conversion layer respectively corresponding to the pixel areas may be less than a depth of the groove.

In an embodiment, the display panel may be configured to emit a light to the color conversion panel, and the color conversion layer may be configured to convert a color of the light emitted from the display panel.

A color conversion panel according to embodiments may include a substrate, a light shielding pattern disposed on the substrate, a color conversion layer disposed on the substrate, covering the light shielding pattern, and configured to convert an incident light, a height of a first portion of the color conversion layer overlapping the light shielding pattern from the substrate being less than a height of a second portion of the color conversion layer not overlapping the light shielding pattern from the substrate, and a light shielding partition wall disposed on the color conversion layer and overlapping the light shielding pattern.

The color conversion panel may include the color conversion layer in which a height of the first portion of the color conversion layer corresponding to the non-pixel area is less than heights of the second portion of the color conversion layer respectively corresponding to the pixel areas. Therefore, light converted by color conversion material included in the color conversion layer may be reflected in a vicinity of a boundary between the pixel area and the non-pixel area and emitted through the substrate, and a light efficiency of the color conversion panel may increase.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween.

Like numerals indicate like components. Moreover, in the drawings, thicknesses, ratios, and dimensions of components are exaggerated for effectively explaining the technical contents.

The term "and/or" includes one or more combinations defined by associated components.

Although the terms first, second, etc. may be used herein to describe various components, these components should not be limited by these terms. These terms are only used to distinguish one component from another component. For example, a first component could be termed a second component, and vice versa without departing from the scope of the present inventive concept. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

The terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

Hereinafter, display devices and color conversion panels in accordance with embodiments will be explained in detail with reference to the accompanying drawings.

Figure 1:
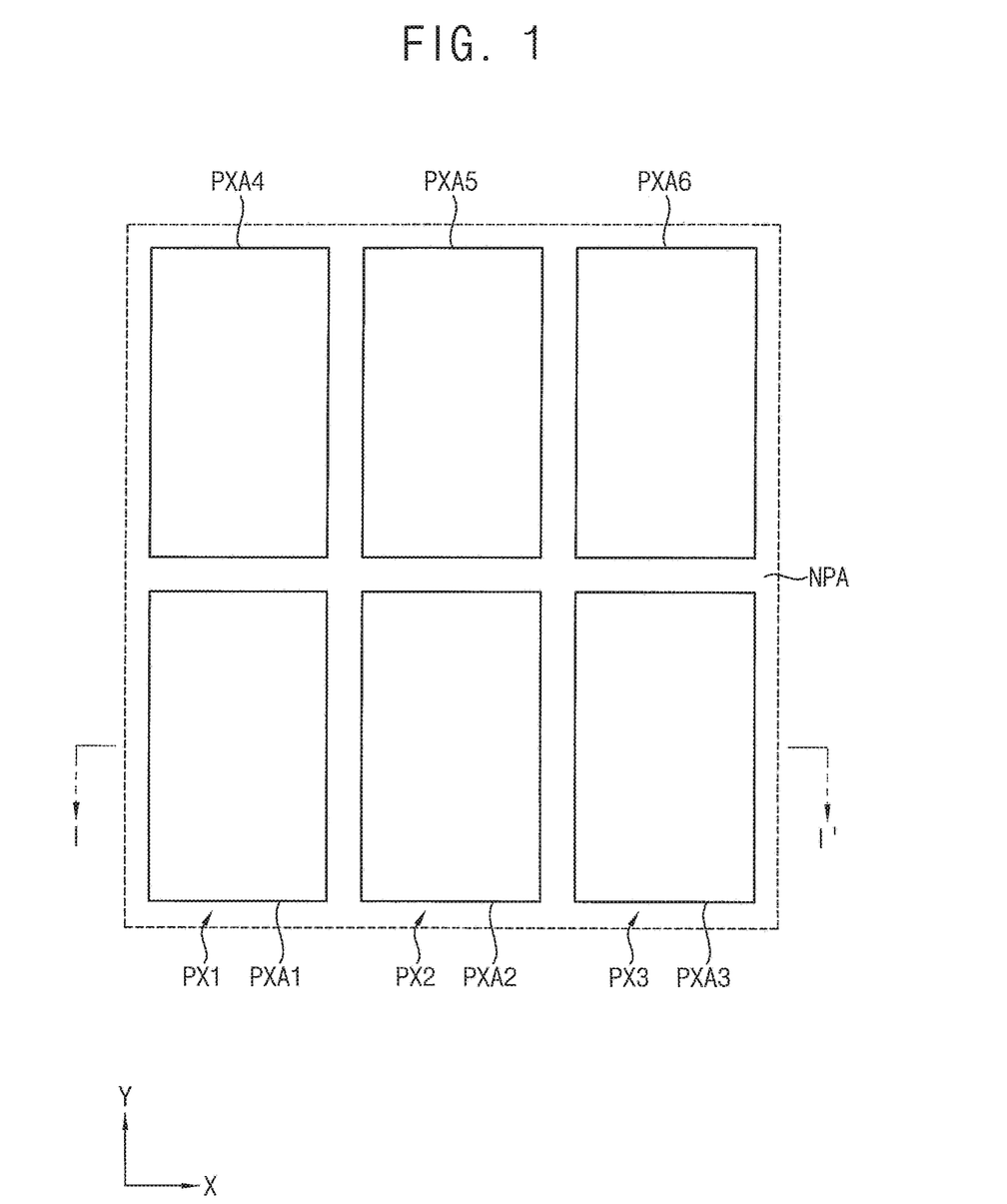
FIG. 1 is a plan view illustrating a display device according to an embodiment.

FIG. 1 is a plan view illustrating a display device according to an embodiment.

Referring to FIG. 1, a display device includes a plurality of pixels arranged substantially in a matrix form. As used herein, 'pixels' refer to regions formed by dividing a display area that displays color images, and one pixel may express a predetermined primary color. That is, one pixel may be a minimum unit of the display device that may express a color independent from other pixels.

The pixels may include a first pixel PX1 which displays a first color, a second pixel PX2 which displays a second color having a shorter peak wavelength than the first color, and a third pixel PX3 which displays a third color having a shorter peak wavelength than the second color. In an embodiment, the first pixel PX1 may be a pixel which displays the first color (e.g., red) having a peak wavelength in a range from about 610 nanometers (nm) to about 650 nm, the second pixel PX2 may be a pixel which displays the second color (e.g., green) having a peak wavelength in a range from about 530 nm to about 570 nm, and the third pixel PX3 may be a pixel which displays the third color (e.g., blue) having a peak wavelength in a range from about 430 nm to about 470 nm.

In an embodiment, the first pixel PX1, the second pixel PX2, and the third pixel PX3 arranged sequentially in an X-axis direction may form a basic unit, and the basic unit may be repeated in the X-axis direction. The display device may include a first pixel area PXA1, a second pixel area PXA2, and a third pixel area PXA3 on which the first pixel PX1, the second pixel PX2, and the third pixel PX3 are respectively located, and which are arranged in the X-axis direction.

In an embodiment, each of the first pixel PX1, the second pixel PX2, and the third pixel PX3 may be arranged in a Y-axis direction. The display device may include a fourth pixel area PXA4, a fifth pixel area PXA5, and a sixth pixel area PXA6 on which the first pixel PX1, the second pixel PX2, and the third pixel PX3 are respectively located, and which are respectively arranged in the Y-axis direction from the first pixel area PXA1, the second pixel area PXA2, and the third pixel area PXA3. Each of the first to sixth pixel areas PXA1, PXA2, PXA3, PXA4, PXA5, and PXA6 may be an emission area that emits light having the first color, the second color, or the third color.

The display device may include a non-pixel area NPA disposed between the first to sixth pixel areas PXA1, PXA2, PXA3, PXA4, PXA5, and PXA6. For example, the non-pixel area NPA may surround the first to sixth pixel areas PXA1, PXA2, PXA3, PXA4, PXA5, and PXA6. The non-pixel area NPA may be a non-emission area that does not emit light.

Figure 2:
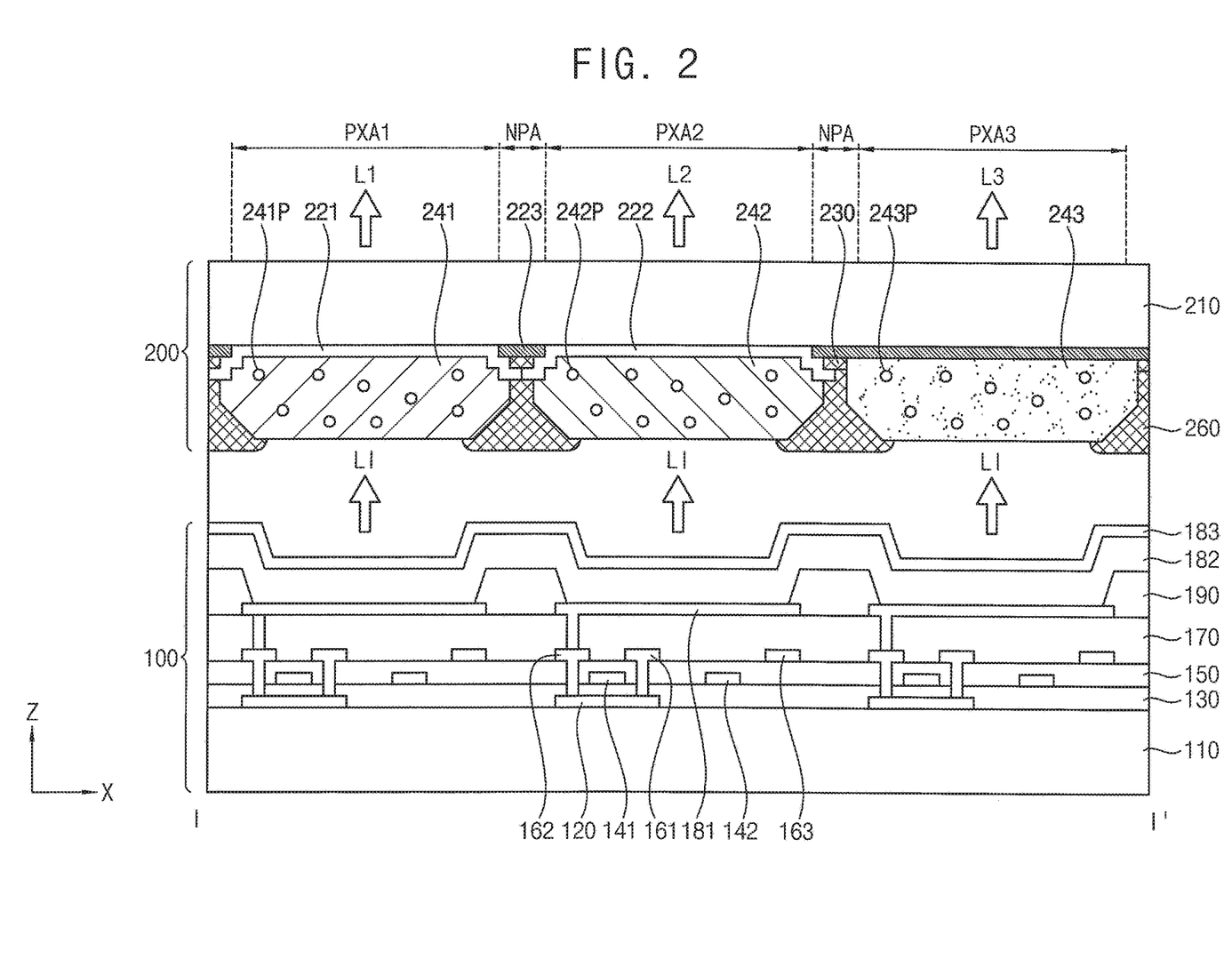
FIG. 2 is a cross-sectional view taken along a line I-I' in FIG. 1.

FIG. 2 is a cross-sectional view taken along a line I-I' in FIG. 1.

Referring to FIGS. 1 and 2, the display device may include a display panel 100 and a color conversion panel 200. The display panel 100 may include a base substrate 110, a semiconductor layer 120, a gate insulation layer 130, a gate electrode 141, a gate line 142, an insulation interlayer 150, a source electrode 161, a drain electrode 162, a data line 163, a planarization layer 170, a first electrode 181, a pixel defining layer 190, an emission layer 182, and a second electrode 183. The display panel 100 may provide incident light LI to the color conversion panel 200.

The semiconductor layer 120 may be disposed on the base substrate 110 and include amorphous silicon, polycrystalline silicon, an oxide semiconductor, or the like. The gate insulation layer 130 may be disposed on the semiconductor layer 120 and include silicon nitride, silicon oxide, or the like.

The gate electrode 141 and the gate line 142 including conductive material may be disposed on the gate insulation layer 130. The gate electrode 141 may overlap the semiconductor layer 120. The gate line 142 may extend in one direction and transmit a gate signal. The insulation interlayer 150 including silicon nitride, silicon oxide, or the like may be disposed on the gate electrode 141 and the gate line 142.

The source electrode 161, the drain electrode 162, and the data line 163 including conductive material may be disposed on the insulation interlayer 150. The source electrode 161 and the drain electrode 162 may be connected to the semiconductor layer 120. The data line 163 may extend in a direction crossing the gate line 142 and transmit a data signal. The planarization layer 170 including inorganic material such as silicon nitride, silicon oxide, etc. and/or organic material such as polyimide, etc. may be disposed on the source electrode 161, the drain electrode 162, and the data line 163.

The first electrode 181 including conductive material may be disposed on the planarization layer 170. The first electrode 181 may be connected to the source electrode 161 or the drain electrode 162. The pixel defining layer 190 including an opening that exposes a portion of the first electrode 181 may be disposed on the planarization layer 170.

The emission layer 182 may be disposed on the first electrode 181. The emission layer 182 may include material emitting light having the third color. The second electrode 183 including conductive material may be disposed on the emission layer 182. The emission layer 182 may emit the incident light LI having the third color in a direction (a Z-axis direction) above the display panel 100 based on an electric field formed between the first electrode 181 and the second electrode 182. In an embodiment, the emission layer 182 may be formed on the first electrode 181 and the pixel defining layer 190. In an embodiment, the emission layer 182 may be formed in the opening of the pixel defining layer 190 on the first electrode 181.

The color conversion panel 200 may overlap the display panel 100. In an embodiment, the color conversion panel 200 may be located in a direction (the Z-axis direction) above the display panel 100. The color conversion panel 200 may receive the incident light LI from the display panel 100, and may emit first light L1, second light L2, and third light L3 in the Z-axis direction. The color conversion panel 200 may include a substrate 210, a first color filter 221, a second color filter 222, a first light shielding pattern 223, a second light shielding pattern 230, a first color conversion layer 241, a second color conversion layer 242, a transmitting layer 243, and a light shielding partition wall 260.

The substrate 210 may be a transparent insulating substrate. For example, the substrate 210 may be formed of glass, quartz, transparent plastic, or the like. In an embodiment, the substrate 210 may be a flexible substrate.

The first color filter 221 may be disposed on the substrate 210. The first color filter 221 may be disposed to correspond to the first pixel PX1. The first color filter 221 may be a wavelength-selective optical filter that transmits only predetermined wavelength bands of incident light by transmitting light within a certain wavelength band (or bands) and blocking light of other wavelength bands. For example, the first color filter 221 may include a colorant or dye that absorbs light of a specific wavelength band.

In an embodiment, the first color filter 221 may selectively transmit light having a peak wavelength longer than the peak wavelength of the incident light LI provided by the display panel 100, and may block the incident light LI. For example, the first color filter 221 may transmit the first light LI having the first color converted by the first color conversion layer 241, and may absorb the incident light LI having the third color which is not converted by the first color conversion layer 241.

The second color filter 222 may be disposed on the substrate 210. The second color filter 222 may be disposed to correspond to the second pixel PX2. The second color filter 222 may be a wavelength-selective optical filter that transmits only predetermined wavelength bands of incident light by transmitting light within a certain wavelength band and blocking light of other wavelength bands. For example, the second color filter 222 may include a colorant or dye that absorbs light of a specific wavelength band.

In an embodiment, the second color filter 222 may selectively transmit light having a peak wavelength longer than the peak wavelength of the incident light LI provided by the display panel 100, and may block the incident light LI. For example, the second color filter 222 may transmit the second light L2 having the second color converted by the second color conversion layer 242, and may absorb the incident light LI having the third color which is not converted by the second color conversion layer 242.

The first light shielding pattern 223 may be disposed on the substrate 210. The first light shielding pattern 223 may be disposed in the non-pixel area NPA. Furthermore, the first light shielding pattern 223 may be disposed to correspond to the third pixel PX3. The first light shielding pattern 223 may be a wavelength-selective optical filter that transmits only predetermined wavelength bands of incident light by transmitting light having certain wavelength band and blocking light having other wavelength band. For example, the first light shielding pattern 223 may include a colorant or dye that absorbs light of a specific wavelength band.

In an embodiment, the first light shielding pattern 223 may selectively transmit the incident light LI provided by the display panel 100, and may block the first light L1 and the second light L2. For example, the first light shielding pattern 223 may transmit the third light L3 having the third color that corresponds to the incident light LI (e.g., is the same color), and may absorb or reflect the first light L1 having the first color and the second light L2 having the second color.

The second light shielding pattern 230 may be disposed on the first light shielding pattern 223. The second light shielding pattern 230 may be disposed in the non-pixel area NPA. The second light shielding pattern 230 may block the transmission of light. The second light shielding pattern 230 may include a material that can block the transmission of light, for example, an organic material including a coloring agent such as a black pigment or dye. The material of the second light shielding pattern 230 may also include, for example, inorganic pigments such as carbon black, titanium black, lignin black, perylene black, cyanine black, a complex oxide pigment such as iron/manganese, and combinations of the above pigments. The first light shielding pattern 223 and the second light shielding pattern 230 may form a light shielding pattern BM. The light shielding pattern BM may block external light toward the display device from outside.

The first color conversion layer 241 may be disposed on the substrate 210 with the first color filter 221 in between. In other words, the first color filter 221 may be disposed between the substrate 210 and the first color conversion layer 241. The first color conversion layer 241 may convert the color of transmitted light into a color different from that of incident light. That is, light may be converted into light of a predetermined wavelength band as it passes through the first color conversion layer 241. The first color conversion layer 241 may include a first color conversion material 241P that converts the peak wavelength of incident light to a predetermined peak wavelength.

In an embodiment, the first color conversion layer 241 may convert the color of the incident light LI provided by the display panel 100. For example, the first color conversion layer 241 may convert the incident light LI having the third color into the first light LI having the first color. The first light L1 may be emitted in a direction (the Z-axis direction) above the color conversion panel 200 through the first color filter 221. Accordingly, the first pixel PX1 may display the first color.

The second color conversion layer 242 may be disposed on the substrate 210 with the second color filter 222 in between. In other words, the second color filter 222 may be disposed between the substrate 210 and the second color conversion layer 242. The second color conversion layer 242 may convert the color of transmitted light into a color different from that of incident light. That is, light may be converted into light of a predetermined wavelength band as it passes through the second color conversion layer 242. The second color conversion layer 242 may include a second color conversion material 242P that converts the peak wavelength of incident light to a predetermined peak wavelength.

In an embodiment, the second color conversion layer 242 may convert the color of the incident light LI provided by the display panel 100. For example, the second color conversion layer 242 may convert the incident light LI having the third color into the second light L2 having the second color. The second light L2 may be emitted in a direction (the Z-axis direction) above the color conversion panel 200 through the second color filter 222. Accordingly, the second pixel PX2 may display the second color.

The first color conversion material 241P may be a material that emits light having the first color. The size of the first color conversion material 241P may be in a range from about 55 Å to about 65 Å. The second color conversion material 242P may be a material that emits light having the second color. The size of the second color conversion material 242P may be in a range from about 40 Å to about 50 Å.

In an embodiment, each of the first color conversion layer 241 and the second color conversion layer 242 may include at least one of quantum dot and fluorescent substance. In other words, each of the first color conversion material 241P and the second color conversion material 242P may be at least one of quantum dot and fluorescent substance.

The quantum dot may emit light of a specific color when an electron transitions from a conduction band to a valence band. The quantum dot may have a core-shell structure. The core may include a semiconductor nanocrystalline material. For example, the core may include silicon (Si) nanocrystals, group II-VI compound nanocrystals, group III-V compound nanocrystals, or the like. In an embodiment, the quantum dot may include a core including cadmium selenide (CdSe), cadmium telluride (CdTe), cadmium sulfide (CdS) or indium phosphide (InP), and an outer shell including zinc sulfide (ZnS).

The transmitting layer 243 may be disposed on the substrate 210 with the first light shielding pattern 223 in between. In other words, the first light shielding pattern 223 may be disposed between the substrate 210 and the transmitting layer 243. The transmitting layer 243 may be disposed to correspond to the third pixel PX3. The transmitting layer 243 may transmit incident light without changing the color of the incident light. That is, light may not be converted as it passes through the transmitting layer 243. The transmitting layer 243 may include a transmitting material 243P.

In an embodiment, the transmitting layer 243 may transmit the incident light LI provided by the display panel 100. For example, the transmitting layer 243 may transmit the incident light LI having the third color, and may emit the third light L3 having the third color. The incident light LI provided by the display panel 100 may be transmitted by the transmitting layer 243, and may be emitted in a direction (the Z-axis direction) above the color conversion panel 200. Accordingly, the third pixel PX3 may display the third color.

The transmitting material 243P may be a light-scattering material that scatters light transmitted through the transmitting layer 243. The characteristics of the transmitting material 243P are not particularly limited as long as they can scatter and reflect transmitted light. For example, the transmitting material 243P may be a metal oxide particle, an organic particle, or the like. For example, the metal oxide may include titanium oxide, zirconium oxide, aluminum oxide, indium oxide, zinc oxide, tin oxide, or the like, and the organic material may include acrylic resin, urethane resin, or the like.

The light shielding partition wall 260 may be disposed in the non-pixel area NPA on the first color conversion layer 241, the second color conversion layer 242, and the transmitting layer 243. The light shielding partition wall 260 may be disposed between the first color conversion layer 241, the second color conversion layer 242, and the transmitting layer 243.

The light shielding partition wall 260 may divide regions on which the first color conversion layer 241, the second color conversion layer 242, and the transmitting layer 243 are respectively disposed. Furthermore, the light shielding partition wall 260 may block the transmission of light. The light shielding partition wall 260 may include a material that can block the transmission of light, for example, an organic material including a coloring agent such as a black pigment or dye. In an embodiment, the light shielding partition wall 260 may include a material substantially the same as that of the second light shielding pattern 230. The light shielding partition wall 260 may prevent a color mixture between the pixels PX1, PX2, and PX3.

Hereinafter, a color conversion panel 300 according to an embodiment will be described with reference to FIGS. 3 and 4.

Figure 3:
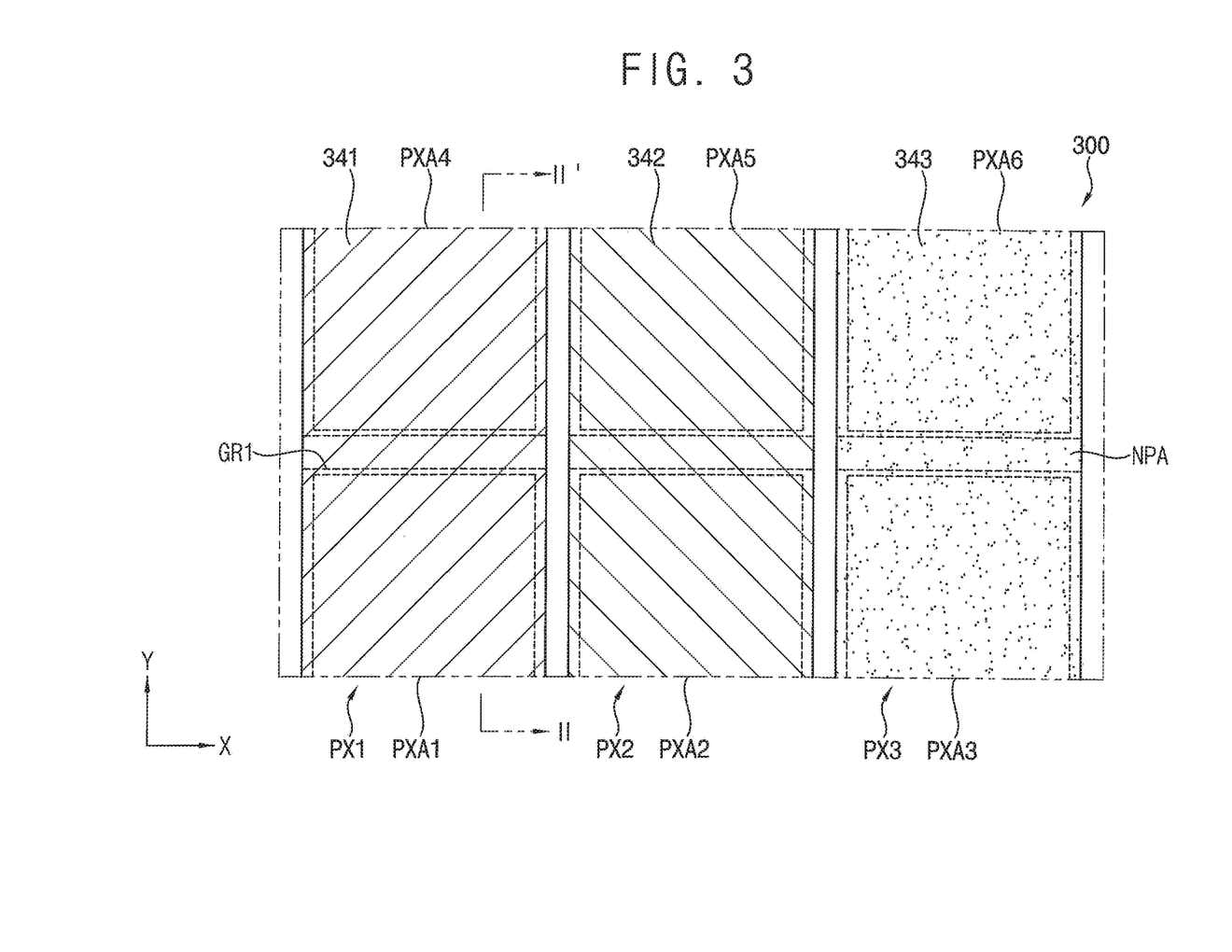
FIG. 3 is a plan view illustrating a color conversion panel according to an embodiment.

FIG. 3 is a plan view illustrating a color conversion panel 300 according to an embodiment. For example, the color conversion panel 300 in FIG. 3 may illustrate an example of the color conversion panel 200 in FIG. 2.

Referring to FIG. 3, the color conversion panel 300 may include a plurality of pixel areas PXA1, PXA2, PXA3, PXA4, PXA5, and PXA6 and a non-pixel area NPA between the pixel areas PXA1, PXA2, PXA3, PXA4, PXA5, and PXA6. Each of a first color conversion layer 341, a second color conversion layer 342, and a transmitting layer 343 may extend in the Y-axis direction. The first color conversion layer 341 may extend in the Y-axis direction, and may be commonly disposed in a plurality of first pixels PX1. The second color conversion layer 342 may extend in the Y-axis direction, and may be commonly disposed in a plurality of second pixels PX2. The transmitting layer 343 may extend in the Y-axis direction, and may be commonly disposed in a plurality of third pixels PX3. Accordingly, the first pixel area PXA1 and the fourth pixel area PXA4 may each emit light having the first color, the second pixel area PXA2 and the fifth pixel area PXA5 may each emit light having the second color, and the third pixel area PXA3 and the sixth pixel area PXA6 may each emit light having the third color.

Figure 4:
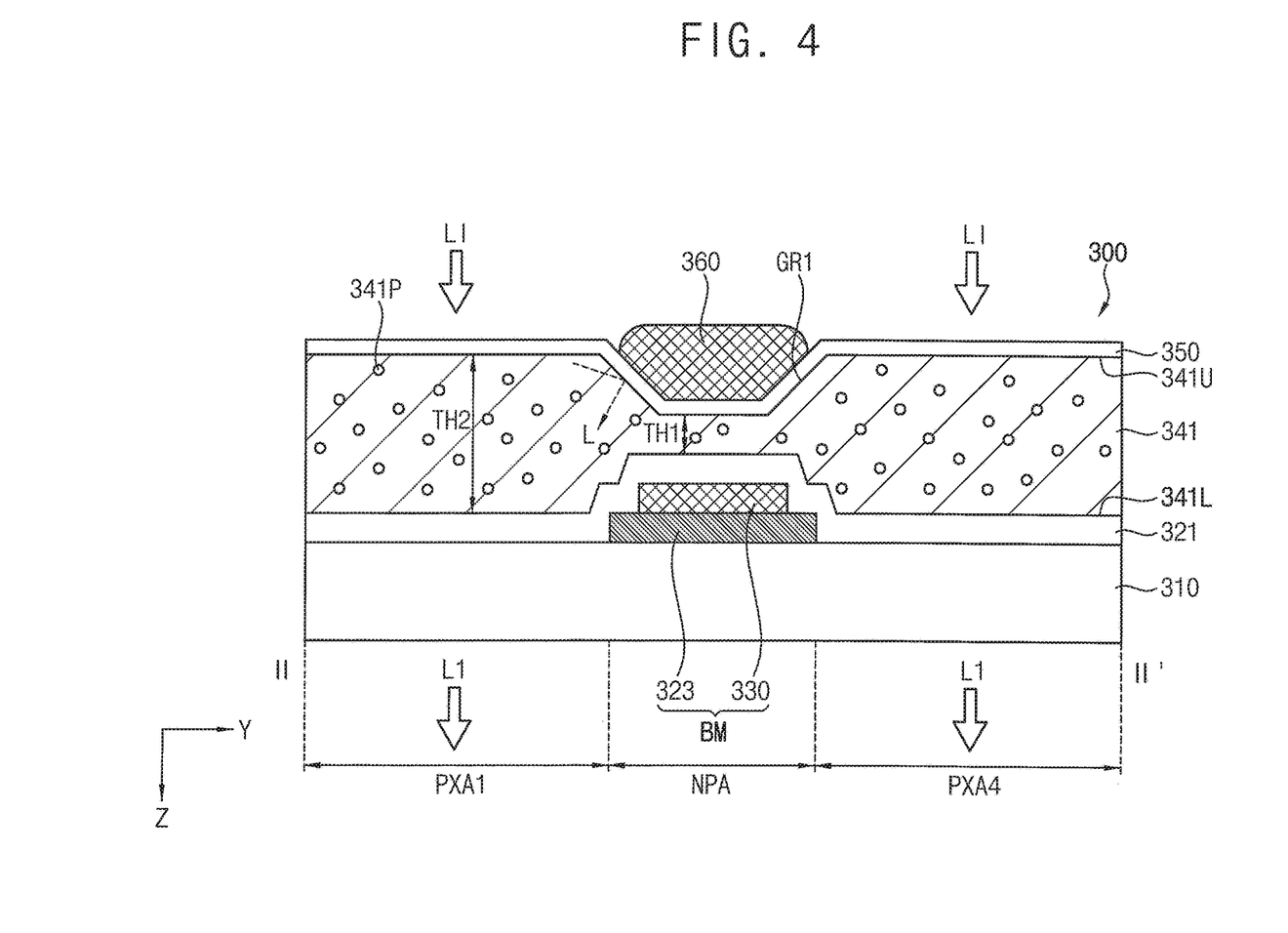
FIG. 4 is a cross-sectional view taken along a line II-II' in FIG. 3.

FIG. 4 is a cross-sectional view taken along a line II-II' in FIG. 3. FIG. 4 illustrates the first pixel area PXA1, the non-pixel area NPA, and the fourth pixel area PXA4 of the color conversion panel 300 which are arranged in the Y-axis direction. Although it is not illustrated in FIG. 4, descriptions on elements of the color conversion panel 300 described with reference to FIG. 4 may be applied to the second pixel area PXA2, the non-pixel area NPA, and the fifth pixel area PXA5 of the color conversion panel 300 which are arranged in the Y-axis direction and/or the third pixel area PXA3, the non-pixel area NPA, and the sixth pixel area PXA6 of the color conversion panel 300 which are arranged in the Y-axis direction as it is or modified.

Referring to FIGS. 3 and 4, the color conversion panel 300 may include a substrate 310, a light shielding pattern BM, a first color filter 321, the first color conversion layer 341, a capping layer 350, and a light shielding partition wall 360.

The light shielding pattern BM may be disposed on the substrate 310 in the non-pixel area NPA. The light shielding pattern BM may include a first light shielding pattern 323 disposed on the substrate 310 and a second light shielding pattern 330 disposed on the first light shielding pattern 323. The light shielding pattern BM may block external light incident onto the color conversion panel 300.

The first color filter 321 covering the light shielding pattern BM may be disposed on the substrate 310. The first color filter 321 may be disposed in the first pixel area PXA1, the non-pixel area NPA, and the fourth pixel area PXA4. The first color filter 321 may block the incident light LI that is not converted by the first color conversion layer 341.

The first color conversion layer 341 may be disposed on the first color filter 321. The first color conversion layer 341 may be disposed in the first pixel area PXA1, the non-pixel area NPA, and the fourth pixel area PXA4, and may completely overlap each of these areas. The first color conversion layer 341 may convert the color of the incident light LI. For example, the first color conversion layer 341 may convert the incident light LI having the third color into the first light L1 having the first color.

A first groove GR1 may be formed in a first portion of the first color conversion layer 341 which corresponds to the non-pixel area NPA. The first groove GR1 may be formed on an upper surface 341U of the first color conversion layer 341 in the non-pixel area NPA. The first groove GR1 may have a shape depressed from the upper surface 341U of the first color conversion layer 341 toward the substrate 310, e.g., in the Z-axis direction. The first groove GR1 may completely overlap the non-pixel area NPA.

In an embodiment, the first groove GR1 may have a line shape in a plan view. The first groove GR1 may extend in the X-axis direction substantially perpendicular to the Y-axis direction and the Z-axis direction in which the first color conversion layer 341 extends in the non-pixel area NPA.

Due to the formation of the first groove GR1, a height of the first portion of the first color conversion layer 341 which corresponds to the non-pixel area NPA from the substrate 310 may be lower than heights of second portions of the first color conversion layer 341 which respectively correspond to the pixel areas PXA1 and PXA4 from the substrate 310. In other words, a height of the first portion of the first color conversion layer 341 which overlaps the light shielding pattern BM from the substrate 310 may be lower than heights of the second portions of the first color conversion layer 341 which do not overlap the light shielding pattern BM from the substrate 310. Accordingly, a distance from the substrate 310 to the upper surface 341U of the first portion of the first color conversion layer 341 which corresponds to the non-pixel area NPA may be less than a distance from the substrate 310 to the upper surface 341U of the second portions of the first color conversion layer 341 which respectively correspond to the pixel areas PXA1 and PXA4.

A height of the first color conversion layer 341 from the substrate 310 at the vicinity of a boundary (e.g., adjacent to the boundary) between the pixel area PXA1 and PXA4 to the non-pixel area NPA may decrease (e.g., progressively decrease) closer to the non-pixel area NPA. A height of the first color conversion layer 341 from the substrate 310 at the vicinity of a boundary between the first pixel area PXA1 to the non-pixel area NPA may decrease closer to the non-pixel area NPA, and a height of the first color conversion layer 341 from the substrate 310 at the vicinity of a boundary between the fourth pixel area PXA4 to the non-pixel area NPA may decrease closer to the non-pixel area NPA. Accordingly, side portions of the first groove GR1 may be inclined in a predetermined angle with respect to the upper surface 341U of the first color conversion layer 341.

A first thickness TH1 of the first portion of the first color conversion layer 341 which corresponds to the non-pixel area NPA may be less than second thicknesses TH2 of the second portions of the first color conversion layer 341 which respectively correspond to the pixel areas PXA1 and PXA4. A thickness of the first color conversion layer 341 may be defined as a distance between a lower surface 341L and the upper surface 341U of the first color conversion layer 341. Because the lower surface 341L of the first color conversion layer 341 is formed along a profile of the first color filter 321, a height of the lower surface 341L of the first portion of the first color conversion layer 341 which corresponds to the non-pixel area NPA from the substrate 310 may be higher than heights of the lower surface 341L of the second portions of the first color conversion layer 341 which respectively correspond to the pixel areas PXA1 and PXA4 from the substrate 310. Furthermore, as described above, because the first groove GR1 is formed, a height of the upper surface 341U of the first portion of the first color conversion layer 341 which corresponds to the non-pixel area NPA from the substrate 310 may be lower than heights of the upper surface 341U of the second portion of the first color conversion layer 341 which respectively correspond to the pixel areas PXA1 and PXA4 from the substrate 310. Accordingly, the first thickness TH1 of the first color conversion layer 341 may be less than the second thicknesses TH2 of the first color conversion layer 341.

In the color conversion panel 300 according to an embodiment, the height of the first portion of the first color conversion layer 341 which corresponds (e.g., overlaps) to the non-pixel area NPA from the substrate 310 may be lower than the heights of the second portions of the first color conversion layer 341 which respectively correspond to the pixel areas PXA1 and PXA4 from the substrate 310, so that light L converted by the first color conversion material 341P included in the first color conversion layer 341 may be reflected at the vicinity of the boundary between the pixel area PXA1 and PXA4 and the non-pixel area NPA, e.g., an inclined side portion of the first groove GR1, and emitted through the substrate 310. Accordingly, light efficiency of the color conversion panel 300 may increase.

In an embodiment, the second portions of the first color conversion layer 341 which respectively correspond to the pixel areas PXA1 and PXA4 may be connected to each other through the first portion of the first color conversion layer 341 which corresponds to the non-pixel area NPA. In such an embodiment, the first portion of the first color filter 321 which corresponds to the non-pixel area NPA may not be exposed by the first groove GR1.

The capping layer 350 may be disposed on the first color conversion layer 341. The capping layer 350 may be disposed in the first pixel area PXA1, the non-pixel area NPA, and the fourth pixel area PXA4. The capping layer 350 may be formed along a profile of the upper surface 341U of the first color conversion layer 341. The capping layer 350 may cover the upper surface 341U of the first color conversion layer 341 thereby preventing oxygen, moisture, etc. from entering or flowing into the first color conversion layer 341. Therefore, the capping layer 350 may prevent the first color conversion material 341P included in the first color conversion layer 341 from being oxidized. In an embodiment, the capping layer 350 may include an inorganic insulation material. For example, the capping layer 350 may include silicon oxide, silicon nitride, silicon oxynitride, or the like. In an embodiment, the capping layer 350 may have a multilayer structure including a plurality of layers each formed of the aforementioned materials.

The light shielding partition wall 360 may be disposed on the capping layer 350. The light shielding partition wall 360 may be disposed in the non-pixel area NPA. In other words, the light shielding partition wall 360 may overlap the light shielding pattern BM. For example, the light shielding partition wall 360 may be disposed in the first groove GR1. The light shielding partition wall 360 may prevent a color mixture between incident light LI incident onto the first pixel area PXA1 and incident light LI incident onto the fourth pixel area PXA4.

In an embodiment, a height difference between the light shielding partition wall 360 and the second portions of the first color conversion layer 341 which respectively correspond to the pixel areas PXA1 and PXA4 may be less than a depth of the first groove GR1. For example, a height difference between an upper surface of the light shielding partition wall 360 and an upper surface of the second portions of the first color conversion layer 341 which respectively correspond to the pixel areas PXA1 and PXA4 may be less than a height difference between the upper surface and a lower surface of the light shielding partition wall 360. The light shielding partition wall 360 may serve to planarize an upper portion of the color conversion panel 300. The light shielding partition wall 360 may be formed in the first groove GR1, so that an upper portion of the color conversion panel 300 which is depressed by the first groove GR1 may be planarized, and the color conversion panel 300 may be easily combined with the display panel 100 in FIG. 2.

Hereinafter, a color conversion panel 400 according to an embodiment will be described with reference to FIGS. 5 and 6. Descriptions on elements of the color conversion panel 400 described with reference to FIGS. 5 and 6, which are substantially the same as or similar to those of the color conversion panel 300 described with reference to FIGS. 3 and 4, will not be repeated.

Figure 5:
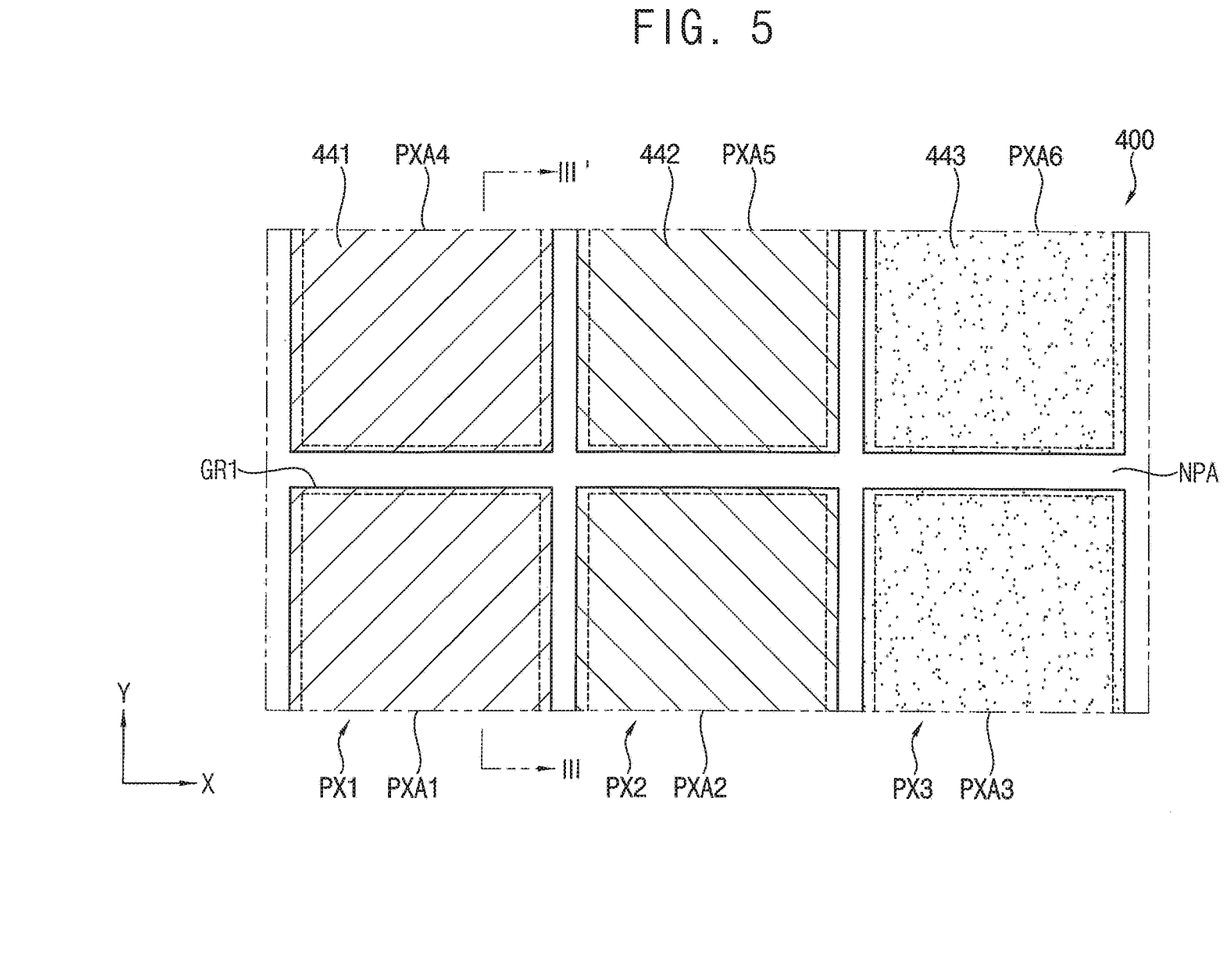
FIG. 5 is a plan view illustrating a color conversion panel according to an embodiment.

FIG. 5 is a plan view illustrating a color conversion panel 400 according to an embodiment. For example, the color conversion panel 400 in FIG. 5 may illustrate another example of the color conversion panel 200 in FIG. 2.

Referring to FIG. 5, a first color conversion layer 441 may be separately disposed for each of the first pixels PX1, a second color conversion layer 442 may be separately disposed for each of the second pixels PX2, and a transmitting layer 443 may be separately disposed for each of the third pixels PX3. In other words, a first color conversion layer 441 disposed in the first pixel area PXA1 and a first color conversion layer 441 disposed in the fourth pixel area PXA4 may be separate from each other, a second color conversion layer 442 disposed in the second pixel area PXA2 and a second color conversion layer 442 disposed in the fifth pixel area PXA5 may be separate from each other, and a transmitting layer 443 disposed in the third pixel area PXA3 and a transmitting layer 443 disposed in the sixth pixel area PXA6 may be separate from each other.

Figure 6:
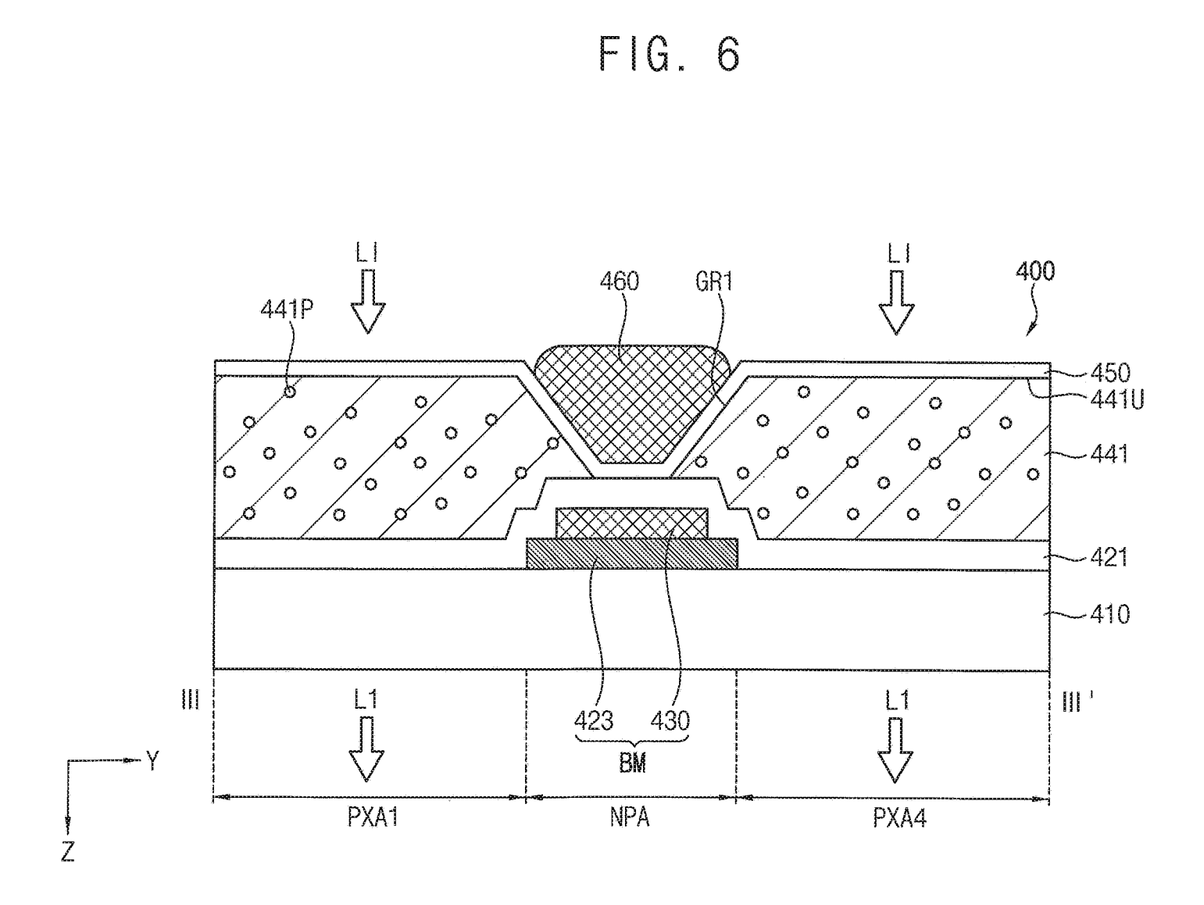
FIG. 6 is a cross-sectional view taken along a line III-III' in FIG. 5.

FIG. 6 is a cross-sectional view taken along a line III-III' in FIG. 5. FIG. 6 illustrates the first pixel area PXA1, the non-pixel area NPA, and the fourth pixel area PXA4 of the color conversion panel 400 which are arranged in the Y-axis direction. Although it is not illustrated in FIG. 6, descriptions on elements of the color conversion panel 400 described with reference to FIG. 6 may be applied to the second pixel area PXA2, the non-pixel area NPA, and the fifth pixel area PXA5 of the color conversion panel 400 which are arranged in the Y-axis direction and/or the third pixel area PXA3, the non-pixel area NPA, and the sixth pixel area PXA6 of the color conversion panel 400 which are arranged in the Y-axis direction as it is or modified.

Referring to FIGS. 5 and 6, the color conversion panel 400 may include a substrate 410, a light shielding pattern BM, a first color filter 421, the first color conversion layer 441, a capping layer 450, and a light shielding partition wall 460.

The first color conversion layer 441 may be disposed on the first color filter 421. The first color conversion layer 441 may be disposed in the first pixel area PXA1 and the fourth pixel area PXA4. Furthermore, the first color conversion layer 441 may be disposed in a portion of the non-pixel area NPA, or may not be disposed in the non-pixel area NPA. For example, the first color conversion layer 441 may be disposed in a first portion of the non-pixel area NPA adjacent to the first pixel area PXA1 and a second portion of the non-pixel area NPA adjacent to the fourth pixel area PXA4.

In an embodiment, portions of the first color conversion layer 441 which respectively correspond to the pixel areas PXA1 and PXA4 may be separated from each other. In such an embodiment, a portion of the first color filter 421 which corresponds to the non-pixel area NPA may be exposed by the first groove GR1.

The capping layer 450 may be disposed on the first color conversion layer 441. The capping layer 450 may cover the first color conversion layer 441, and may be formed along a profile of an upper surface 441U of the first color conversion layer 441 and a profile of an upper surface of the first color filter 421 exposed by the first groove GR1.

Hereinafter, a color conversion panel 500 according to an embodiment will be described with reference to FIGS. 7 and 8. Descriptions on elements of the color conversion panel 500 described with reference to FIGS. 7 and 8, which are substantially the same as or similar to those of the color conversion panel 300 described with reference to FIGS. 3 and 4, will not be repeated.

Figure 7:
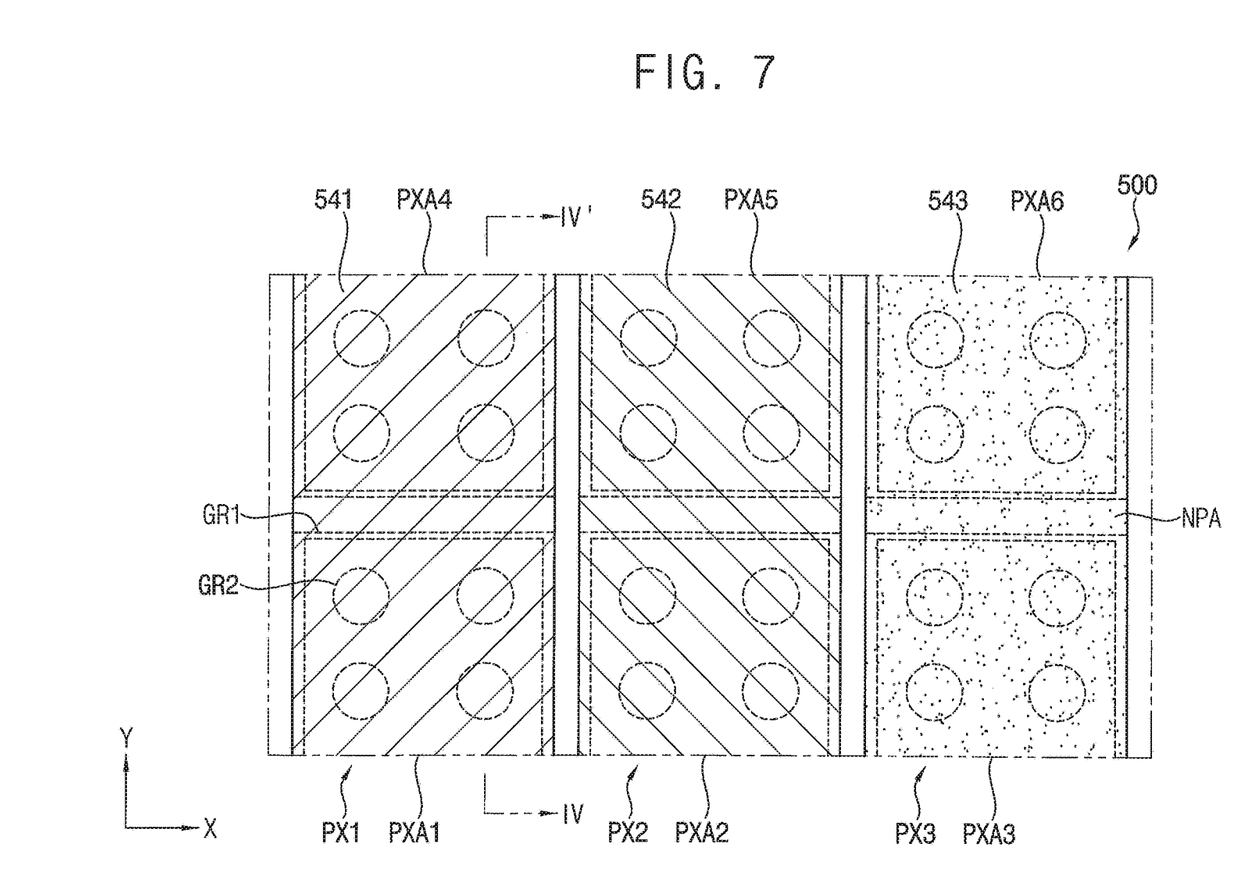
FIG. 7 is a plan view illustrating a color conversion panel according to an embodiment.

FIG. 7 is a plan view illustrating a color conversion panel 500 according to an embodiment. For example, the color conversion panel 500 in FIG. 7 may illustrate another example of the color conversion panel 200 in FIG. 2.

Figure 8:
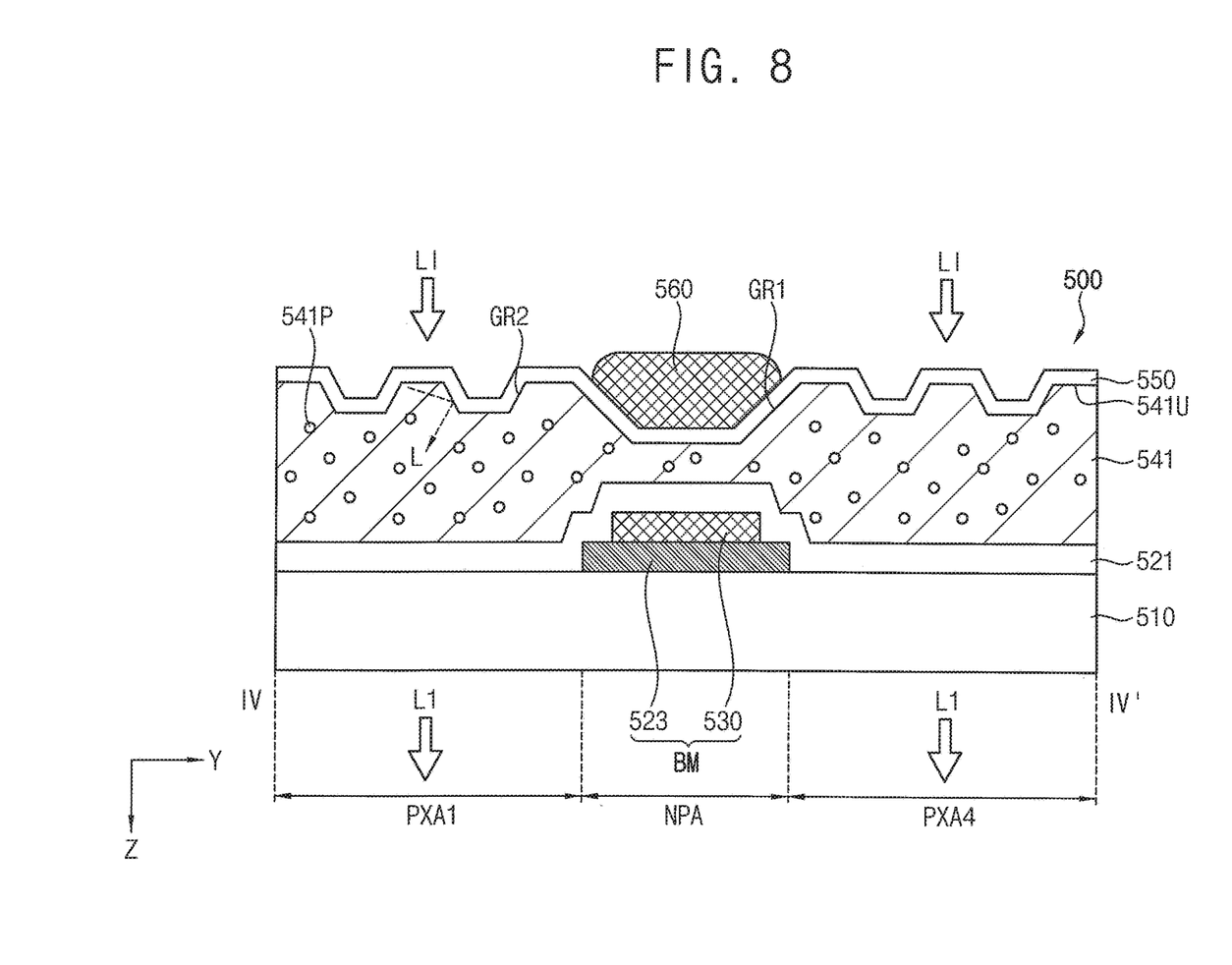
FIG. 8 is a cross-sectional view taken along a line IV-IV' in FIG. 7.

FIG. 8 is a cross-sectional view taken along a line IV-IV' in FIG. 7. FIG. 8 illustrates the first pixel area PXA1, the non-pixel area NPA, and the fourth pixel area PXA4 of the color conversion panel 500 which are arranged in the Y-axis direction. Although it is not illustrated in FIG. 8, descriptions on elements of the color conversion panel 500 described with reference to FIG. 8 may be applied to the second pixel area PXA2, the non-pixel area NPA, and the fifth pixel area PXA5 of the color conversion panel 500 which are arranged in the Y-axis direction and/or the third pixel area PXA3, the non-pixel area NPA, and the sixth pixel area PXA6 of the color conversion panel 500 which are arranged in the Y-axis direction as it is or modified.

Referring to FIGS. 7 and 8, the color conversion panel 500 may include a substrate 510, a light shielding pattern BM, a first color filter 521, a first color conversion layer 541, a capping layer 550, and a light shielding partition wall 560.

Second grooves GR2 may be formed in portions of the first color conversion layer 541 which respectively correspond to (e.g., entirely overlaps with) the first pixel area PXA1 and the fourth pixel area PXA4. The second grooves GR2 may be formed on an upper surface 541U of the first color conversion layer 541 in the first pixel area PXA1 and the fourth pixel area PXA4. Each of the second grooves GR2 may have a shape depressed from the upper surface 541U of the first color conversion layer 541 toward the substrate 510, e.g., in the Z-axis direction. Side portions of each of the second grooves GR2 may be inclined in a predetermined angle with respect to the upper surface 541U of the first color conversion layer 541.

In an embodiment, each of the second grooves GR2 may have a dot shape in a plan view. For example, each of the second grooves GR2 may have a circle shape, an oval shape, a polygonal shape, or the like in a plan view. The second grooves GR2 may be arranged along the X-axis direction and the Y-axis direction in the pixel areas PXA1, PXA2, PXA3, PXA4, PXA5, and PXA6.

In the color conversion panel 500 according to an embodiment, the second grooves GR2 may be formed in the portions of the first color conversion layer 541 which respectively correspond to the first pixel area PXA1 and the fourth pixel area PXA4, so that light L converted by a first color conversion material 541P included in the first color conversion layer 541 may be reflected at the inclined side portion of each of the second grooves GR2, and emitted through the substrate 510. Accordingly, light efficiency of the color conversion panel 500 may increase.

In an embodiment, a depth of the second groove GR2 may be less than a depth of the first groove GR1. As the depth of the second groove GR2 increases, a volume of the first color conversion layer 541 in the first pixel area PXA1 and the fourth pixel area PXA4 may decrease. When the volume of the first color conversion layer 541 decreases, the amount of the first color conversion material 541P included in the first color conversion layer 541 may decrease, and therefore color conversion efficiency of the first color conversion layer 541 may decrease. Accordingly, the depth of the second groove GR2 may be less than the depth of the first groove GR1, so that volume decrease of the first color conversion layer 541 may be minimized, and decrease of color conversion efficiency of the first color conversion layer 541 may be prevented.

FIG. 8 illustrates that portions of the first color conversion layer 541 which respectively correspond to the pixel areas PXA1 and PXA4 are connected to each other through a portion of the first color conversion layer 541 which corresponds to the non-pixel area NPA. However, in the color conversion panel 500 according to an embodiment, portions of the first color conversion layer 541 which respectively correspond to the pixel areas PXA1 and PXA4 may be separated from each other.

The display device according to the embodiments may be applied to a display device included in a computer, a notebook, a mobile phone, a smartphone, a smart pad, a PMP, a PDA, an MP3 player, or the like.

Although the display device and the color conversion panel according to the embodiments have been described with reference to the drawings, the illustrated embodiments are examples, and may be modified and changed by a person having ordinary knowledge in the relevant technical field without departing from the technical spirit described in the following claims.

What is claimed is:

1. A color conversion panel including pixel areas including a first pixel area and a second pixel area each emitting a light having a same color and a non-pixel area between the first pixel area and the second pixel area, wherein the first pixel area and the second pixel area are adjacent to each other with the non-pixel area in between, the color conversion panel comprising:
   a substrate;
   a light shielding pattern disposed on the substrate in the non-pixel area;
   a color conversion layer disposed on the substrate, covering the light shielding pattern, and configured to convert an incident light, a height of a top surface of a first portion of the color conversion layer corresponding to the non-pixel area from the substrate being less than each of heights of top surfaces of second portions of the color conversion layer respectively corresponding to the pixel areas from the substrate; and
   a light shielding partition wall disposed on the color conversion layer in the non-pixel area,
   wherein the first portion of the color conversion layer corresponding to the non-pixel area extends across the non-pixel area, and
   wherein the color conversion layer is a single-layer that includes at least one of a quantum dot and a fluorescent substance.

2. The color conversion panel of claim 1, wherein a height of a top surface of the color conversion layer from the substrate at adjacent to a boundary between the pixel area and the non-pixel area decreases closer to the non-pixel area.

3. The color conversion panel of claim 1, wherein a thickness of the first portion of the color conversion layer corresponding to the non-pixel area is less than each of thicknesses of the second portions of the color conversion layer respectively corresponding to the pixel areas.

4. The color conversion panel of claim 1, wherein the second portions of the color conversion layer respectively corresponding to the pixel areas are connected to each other through the first portion of the color conversion layer corresponding to the non-pixel area.

5. The color conversion panel of claim 1, wherein a first groove is formed at the first portion of the color conversion layer corresponding to the non-pixel area, and wherein the light shielding partition wall is disposed in the first groove.

6. The color conversion panel of claim 5, wherein a height difference between the light shielding partition wall and the second portions of the color conversion layer respectively corresponding to the pixel areas is less than a depth of the first groove.

7. The color conversion panel of claim 5, wherein a second groove is formed at the second portions of the color conversion layer respectively corresponding to the pixel areas.

8. The color conversion panel of claim 7, wherein a depth of the second groove is less than a depth of the first groove.

9. The color conversion panel of claim 7, wherein the first groove has a line shape, and wherein the second groove has a dot shape.

10. The color conversion panel of claim 1, further comprising:

a color filter disposed between the substrate and the color conversion layer and blocking the incident light that is not converted by the light conversion layer.

11. The color conversion panel of claim 1, further comprising:

a capping layer disposed on the color conversion layer.

12. A display device including pixel areas including a first pixel area and a second pixel area each emitting a light having a same color and a non-pixel area between the first pixel area and the second pixel area, wherein the first pixel area and the second pixel area are adjacent to each other with the non-pixel area in between, the display device comprising:

a display panel; and a color conversion panel overlapping the display panel, wherein the color conversion panel comprises:

a substrate;

a light shielding pattern disposed on the substrate in the non-pixel area;

a color conversion layer disposed on the substrate and covering the light shielding pattern, a height of a top surface of a first portion of the color conversion layer corresponding to the non-pixel area from the substrate being less than each of heights of top surfaces of second portions of the color conversion layer respectively corresponding to the pixel areas from the substrate; and a light shielding partition wall disposed on the color conversion layer in the non-pixel area, wherein the first portion of the color conversion layer corresponding to the non-pixel area extends across the non-pixel area, and wherein the color conversion layer is a single-layer that includes at least one of a quantum dot and a fluorescent substance.

13. The display device of claim 12, a height of a top surface of the color conversion layer from the substrate at adjacent to a boundary between the pixel area and the non-pixel area decreases closer to the non-pixel area.

14. The display device of claim 12, wherein a thickness of the first portion of the color conversion layer corresponding to the non-pixel area is less than each of thicknesses of the second portions of the color conversion layer respectively corresponding to the pixel areas.

15. The display device of claim 12, wherein a groove is formed at the first portion of the color conversion layer corresponding to the non-pixel area, and wherein the light shielding partition wall is disposed in the groove.

16. The display device of claim 15, wherein a height difference between the light shielding partition wall and the second portions of the color conversion layer respectively corresponding to the pixel areas is less than a depth of the groove.

17. The display device of claim 12, wherein the display panel is configured to emit a light to the color conversion panel, and wherein the color conversion layer configured to convert a color of the light emitted from the display panel.

* * * * *